United States Patent
Zhang et al.

(10) Patent No.: US 11,554,435 B2
(45) Date of Patent: Jan. 17, 2023

(54) SOLDER PASTE LASER INDUCED FORWARD TRANSFER DEVICE AND METHOD

(71) Applicant: SOUTH CHINA UNIVERSITY OF TECHNOLOGY, Guangzhou (CN)

(72) Inventors: Xianmin Zhang, Guangzhou (CN); Yilin Shan, Guangzhou (CN); Kai Li, Guangzhou (CN); Chuangang Tang, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 463 days.

(21) Appl. No.: 16/733,751

(22) Filed: Jan. 3, 2020

(65) Prior Publication Data

US 2020/0215633 A1 Jul. 9, 2020

(30) Foreign Application Priority Data

Jan. 4, 2019 (CN) .......................... 201910007552.8

(51) Int. Cl.
*B23K 1/005* (2006.01)
*G02B 27/09* (2006.01)
(Continued)

(52) U.S. Cl.
CPC ........ *B23K 1/0056* (2013.01); *G02B 27/0955* (2013.01); *G05B 15/02* (2013.01);
(Continued)

(58) Field of Classification Search
CPC ............. H05K 3/341; H05K 2203/107; H05K 3/3485; H05K 3/34; G02B 27/0955;
(Continued)

(56) References Cited

U.S. PATENT DOCUMENTS 6,792,326 B1* 9/2004 Duignan ................ B23K 26/04
430/11
8,728,589 B2* 5/2014 Auyeung ............... H05K 3/046
427/595
(Continued)

FOREIGN PATENT DOCUMENTS

CN 105705671 A 6/2016
CN 106842588 A 6/2017
(Continued)

OTHER PUBLICATIONS

Chinese Search Report with English Language Translation based on corresponding Application No. 2019100075528; dated Jan. 4, 2019.

*Primary Examiner* — Donghai D Nguyen
(74) *Attorney, Agent, or Firm* — Muncy, Geissler, Olds & Lowe, P.C.

(57) ABSTRACT

The present invention discloses a solder paste laser induced forward transfer device and method. The device comprises a laser, a beam shaping module, an optical path adjustment module, a solder paste transfer module and a computer control system, wherein the laser is connected to the beam shaping module, followed by the optical path adjustment module, and the solder paste transfer module is located below the optical path adjustment module. The beam shaping module comprises a beam expanding lens, an aperture, a flat-top beam shaper and a spatial light modulator. The optical path adjustment module comprises a two-dimensional galvanometer and an f-θ lens. The solder paste transfer module consists of a transparent substrate, a solder paste film, a clamp, a Z-axis lifting table, a receiving substrate, and an XYZ precise moving platform. The computer control system consists of a computer and drivers of other devices. The device and method can achieve mask-free, non-contact and high-precision solder paste transfer, (Continued)

thereby greatly shortening the production cycle and reducing the production cost.

6 Claims, 4 Drawing Sheets

(51) Int. Cl.
 *G05B 15/02* (2006.01)
 *H05K 3/34* (2006.01)
(52) U.S. Cl.
 CPC ..... *H05K 3/341* (2013.01); *H05K 2203/0139* (2013.01); *H05K 2203/107* (2013.01)
(58) Field of Classification Search
 CPC .. G05B 15/02; B23K 1/0056; B23K 26/0622; B23K 26/0648; B23K 26/082; B23K 26/34; Y10T 29/49147; Y10T 29/53204; Y10T 29/53261; Y10T 29/53265
 USPC ................................... 29/746, 759, 760, 842
 See application file for complete search history.

(56) References Cited

U.S. PATENT DOCUMENTS

| | | | |
|---|---|---|---|
| 10,471,538 B2 * | 11/2019 | Zenou | ................... B23K 26/57 |
| 2017/0002344 A1 | 1/2017 | Ringeisen et al. | |

FOREIGN PATENT DOCUMENTS

| | | |
|---|---|---|
| KR | 20180049697 A | 5/2018 |
| WO | WO2018193446 A1 | 10/2018 |

* cited by examiner

SOLDER PASTE LASER INDUCED FORWARD TRANSFER DEVICE AND METHOD

TECHNICAL FIELD

The present invention relates to a process and device for implementing solder paste transfer by laser induced forward transfer (LIFT), belongs to the field of laser application and solder paste printing technology, and particularly relates to a solder paste laser induced forward transfer device and method.

BACKGROUND ART

SMT (Surface Mount Technology) is a circuit mount and connection technology that mounts pin-free or short lead surface mount components such as resistors, capacitors, transistors, integrated circuits onto a printed circuit board and forms an electrical connection by reflow soldering. Solder paste printing is the first step of the entire SMT process. At present, the solder paste printing technology mainly adopts screen printing, and the screen printing often needs different screens for different PCBs, thus having a relatively high cost and a long cycle, so that the demand for small-scale rapid production cannot be met.

Laser induced forward transfer technology (LIFT technology) is a material deposition technology. In the LIFT technology, a target material is coated onto a transparent substrate in the form of a film in advance, the target material film faces downward to keep a certain distance away from a receiving substrate, and laser irradiates the target material through the transparent substrate to induce material transfer within a local region. Accordingly, the LIFT technology is a mask-free, non-contact and high-precision trace transfer technology.

Because the LIFT technology does not require the preparation of a mask, once applied to solder paste printing, the production cycle of small-scale production can be greatly shortened, the production cost can be reduced, and this technology is especially suitable for laboratory research and industrial small-scale trial production. The use of a laser galvanometer allows beams to scan at a speed far beyond mechanical motion, thereby meeting the demand for production speed in large-scale production.

SUMMARY OF THE INVENTION

The present invention is directed to overcome the above shortcomings and deficiencies in the prior art and to provide a solder paste laser induced forward transfer device and method.

The present invention is achieved by the following technical solution:

A solder paste laser induced forward transfer device, comprising a laser unit and a computer control system 14, characterized by further comprising a solder paste transfer module, wherein the computer control system 14 controls laser beam emit from the laser unit and motion of the solder paste transfer module;

the solder paste transfer module comprises a transparent substrate 8, a clamp 10, a Z-axis lifting table 11, a receiving substrate 12, and an XYZ-axis moving platform 13;

the lower surface of the transparent substrate 8 has a groove for receiving a solder paste film 9;

the receiving substrate 12 and the Z-axis lifting table 11 are placed on the XYZ-axis moving platform 13 to adjust relative positions of the receiving substrate 12 and laser beam spots;

the clamp 10 is mounted on the Z-axis lifting table 11; and the groove of the transparent substrate 8 faces downward and is placed in parallel above the receiving substrate 12, and the clamp 10 clamps the edge of the transparent substrate 8 and is carried by the Z-axis lifting table 11 to vertically lift above the receiving substrate 12 so as to adjust the distance between the transparent substrate 8 and the receiving substrate 12.

The laser unit comprises a laser emitter 1, a beam shaping module, and an optical path adjustment module that are sequentially connected by an optical path;

the laser emitter 1, the beam shaping module, the optical path adjustment module, and the solder paste transfer module are respectively connected to the computer control system 14.

The beam shaping module comprises a beam expanding lens 2, an aperture 3, a flat-top beam shaper 4, and a spatial light modulator 5 that are sequentially connected by an optical path;

the optical path adjustment module comprises a two-dimensional galvanometer 6 and an f-θ lens 7 that are sequentially connected by an optical path.

The groove for receiving the solder paste film 9 has a depth of 20-150 μm.

The receiving substrate 12 is a PCB.

A solder paste laser induced forward transfer method, comprising the following steps:

step 1: importing a circuit drawing of a receiving substrate 12 to be printed into a computer control system 14; planning, by the computer control system 14, a scanning route and scanning speed of a laser beam 15 according to the positions of pads on the receiving substrate 12 to be printed; and selecting laser parameters and parameters of a beam shaping module according to the shape and size of each pad;

step 2: selecting a transparent substrate 8 having a desired groove depth according to the thickness of a solder paste required in actual production, and coating the solder paste into the entire groove by blade coating to form a solder paste film 9 in the groove; keeping the solder paste film 9 facing downward, then fixing the transparent substrate 8 by a clamp 10 to which the Z-axis lifting table 11 is connected; and adjusting the distance between the transparent substrate 8 and the receiving substrate 12;

step 3: before each laser pulse emission, controlling, by the computer control system 14, the rotation of a two-dimensional galvanometer 6 according to the pre-planned route to change the laser beam path;

step 4: causing the beam emitted by the laser emitter 1 and shaped by the beam shaping module to enter an optical path adjustment module composed of the two-dimensional galvanometer 6 and an f-θ lens 7; after the direction of the optical path is changed by the two-dimensional galvanometer 6, finally focusing the beam, after its passing through the f-θ lens 7, above the solder paste film 9 of step 2; wherein the laser beam 15 passes through the transparent substrate 8 and is absorbed by the solder paste film 9, so that the irradiated portion is partially vaporized, bubbles 16 are formed inside the solder paste film 9, the surrounding unvaporized portion is impelled toward the receiving substrate 12 with continuous expansion of the bubbles 16, and a stable bridge structure 17 is formed between the transparent substrate 8 and the receiving substrate 12; and step 5: repeating step 3 and step 4 until stable bridge structures 17 are formed between all the pads on the receiving substrate 12 and the transparent substrate 8; thereafter, controlling, by the computer control system 14, the Z-axis lifting table 11 to rise, so that the transparent substrate 8 vertically leaves the receiving substrate 12, all the bridge structures 17 break to leave solder paste voxles 18, and the entire receiving substrate 12 is thus printed.

Compared with the prior art, the present invention has the following advantages and effects:

The solder paste transfer module of the present invention comprises a transparent substrate 8, a clamp 10, a Z-axis lifting table 11, a receiving substrate 12, and an XYZ-axis moving platform 13; a groove for receiving a solder paste film 9 is formed on the lower surface of the transparent substrate 8; the receiving substrate 12 and the Z-axis lifting table 11 are placed on the XYZ-axis moving platform 13 to adjust relative positions of the receiving substrate 12 and laser beam spots; during operation, the clamp 10 is mounted on the Z-axis lifting table 11, the groove of the transparent substrate 8 faces downward and is placed in parallel above the receiving substrate 12, and the clamp 10 clamps the edge of the transparent substrate 8 and is carried by the Z-axis lifting table 11 to vertically lift above the receiving substrate 12 so as to adjust the distance between the transparent substrate 8 and the receiving substrate 12. The solder paste film 9 on the transparent substrate 8 is transferred to the receiving substrate according to a planned route through high-energy pulsed laser under the coordinated motion of the laser and the moving platform, thereby achieving accurately controlled partial transfer and printing of a solder paste.

In the present invention, the groove for receiving the solder paste film 9 is ingeniously formed on the lower surface of the transparent substrate 8, the receiving substrate 12 and the Z-axis lifting table 11 are placed on the XYZ-axis moving platform 13 to adjust the relative positions of the receiving substrate 12 and the laser beam spots, and a mask-free, non-contact and high-precision solder paste transfer scheme is thus achieved in combination with the high-energy pulsed laser.

The process of the present invention is simple and convenient, thereby effectively simplifying the production process, greatly shortening the production cycle, and reducing the production cost.

DETAILED DESCRIPTION OF THE EMBODIMENTS

Figure 1:
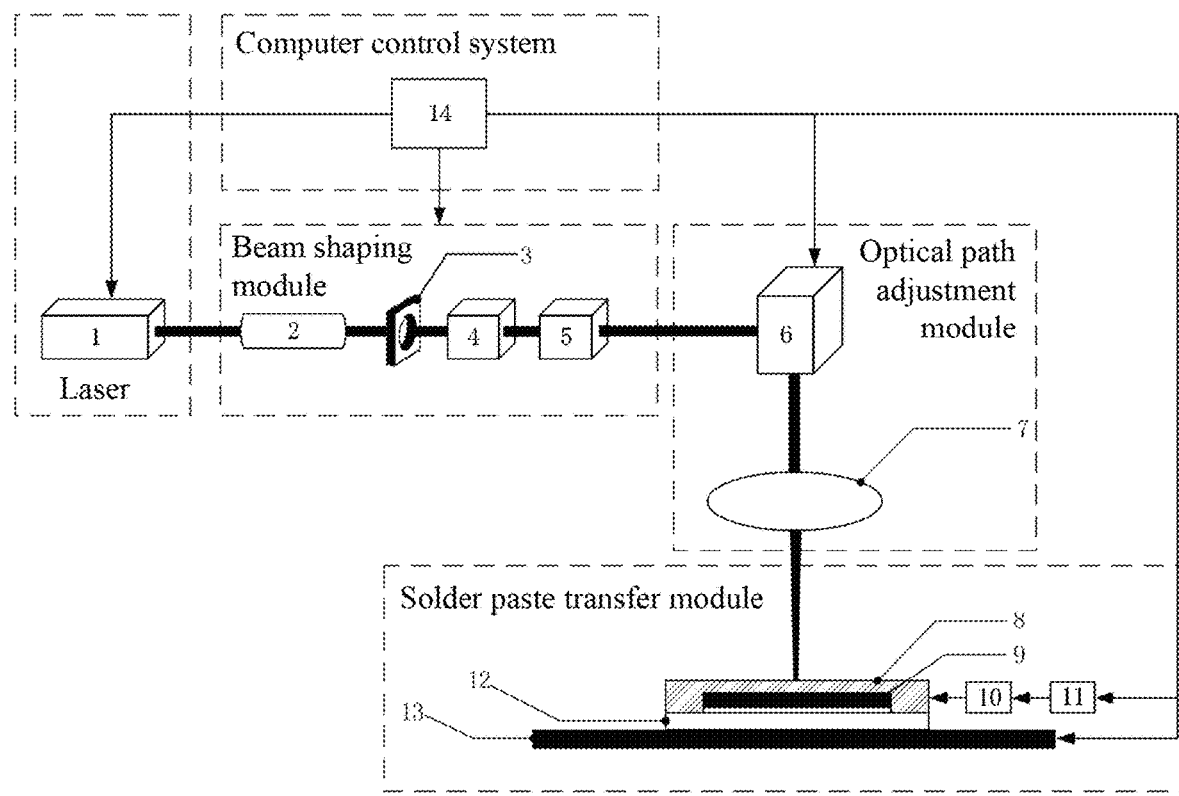
FIG. 1 is a structure diagram of a solder paste laser induced forward transfer device according to the present invention.
Figure 2:
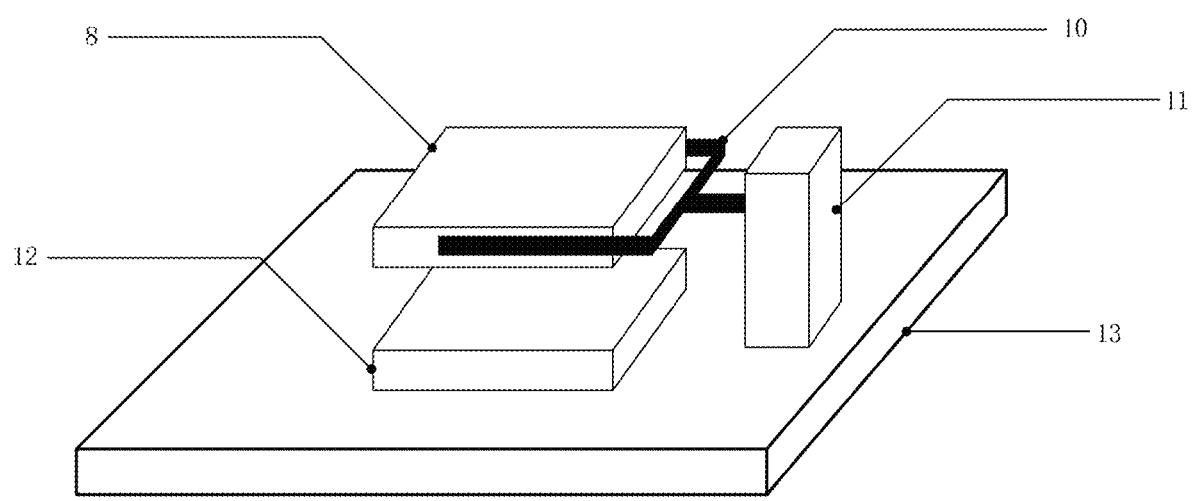
FIG. 2 is a structure diagram of a solder paste transfer module in FIG. 1.

The following further describes the present invention in detail with reference to specific embodiments.

Embodiment

As shown in FIGS. 1-4, the present invention discloses a solder paste laser induced forward transfer device, comprising a laser unit and a computer control system 14, characterized by further comprising a solder paste transfer module, wherein the computer control system 14 controls laser beam emit from the laser unit and motion of the solder paste transfer module;

the solder paste transfer module comprises a transparent substrate 8, a clamp 10, a Z-axis lifting table 11, a receiving substrate 12, and an XYZ-axis moving platform 13;

the lower surface of the transparent substrate 8 has a groove for receiving a solder paste film 9; the transparent substrate 8 is quartz glass or other transparent object.

the receiving substrate 12 and the Z-axis lifting table 11 are placed on the XYZ-axis moving platform 13 to adjust relative positions of the receiving substrate 12 and laser beam spots;

the clamp 10 is mounted on the Z-axis lifting table 11; and the groove of the transparent substrate 8 faces downward and is placed in parallel above the receiving substrate 12, and the clamp 10 clamps the edge of the transparent substrate 8 and is carried by the Z-axis lifting table 11 to vertically lift above the receiving substrate 12 so as to adjust the distance between the transparent substrate 8 and the receiving substrate 12.

The laser unit comprises a laser emitter 1, a beam shaping module, and an optical path adjustment module that are sequentially connected by an optical path; the laser emitter 1, the beam shaping module, the optical path adjustment module, and the solder paste transfer module are respectively connected to the computer control system 14. The beam shaping module comprises a beam expanding lens 2, an aperture 3, a flat-top beam shaper 4, and a spatial light modulator 5 that are sequentially connected by an optical path; after the beam passes through the beam expanding lens 2 and the aperture 3, impurities of spots can be removed; and after being shaped by the flat-top beam shaper 4, the spots in original Gaussian energy distribution can be changed into uniform circular distribution or square distribution. After the beam passes through the spatial light modulator 5, the spatial light modulator 5 converts the spots to the shape and size desired by a user under the control of the computer control system 14.

The optical path adjustment module comprises a two-dimensional galvanometer 6 and an f-θ lens 7 that are sequentially connected by an optical path. The computer control system 14 achieves the movement of the beam within an XY plane by controlling the two-dimensional galvanometer 6, and the beam is finally focused on a target plane by the f-θ lens 7. The f-θ lens 7 has a 355 or 532 nm anti-reflection film, a scan angle of ±15°, and an effective focal length of 120 mm.

The groove for receiving the solder paste film 9 has a depth of 20-150 μm.

The receiving substrate 12 is a PCB, that is, a PCB that needs to be printed with a solder paste.

The solder paste film 9 is made of No. 5-7 powder solder paste, the particle size of the No. 5 powder solder paste is 15-25 μm, the particle size of the No. 6 powder solder paste is 5-15 μm, and the particle size of the No. 7 powder solder paste is 2-11 μm.

The laser emitter 1 is a pulsed laser, and the output light source has a wavelength of 355 or 532 nm, a pulse width of 10-50 ns, and a repetition frequency of 10-100 kHz.

Figure 3:
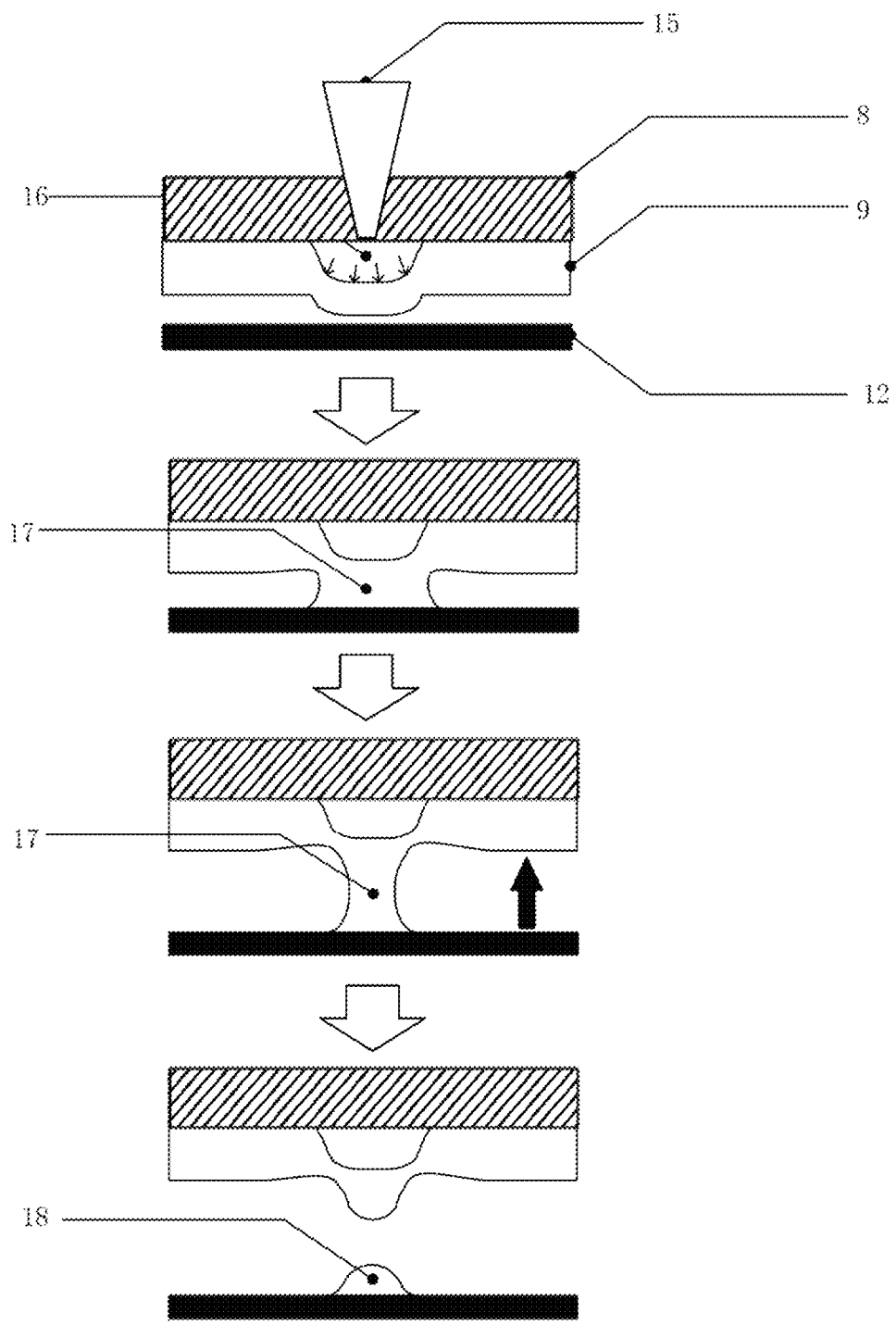
FIG. 3 is a principle diagram of a solder paste laser induced forward transfer process according to the present invention.

The specific principle of solder paste transfer using a laser forward transfer method is shown in FIG. 3. Laser emitted by the laser emitter 1 passes through the beam shaping module and the optical path adjustment module and then is irradiated onto the solder paste film 9 through the transparent substrate 8, so that the solder paste is partially vaporized to generate bubbles 16. With continuous expansion of the bubbles 16, the solder paste film 9 comes into contact with the receiving substrate 12 to form a stable bridge structure 17. When the transparent substrate 8 vertically leaves the receiving substrate 12, the bridge structure 17 is continuously pulled up until the structure is broken, and solder paste voxels 18 are left on the receiving substrate 12.

Figure 4:
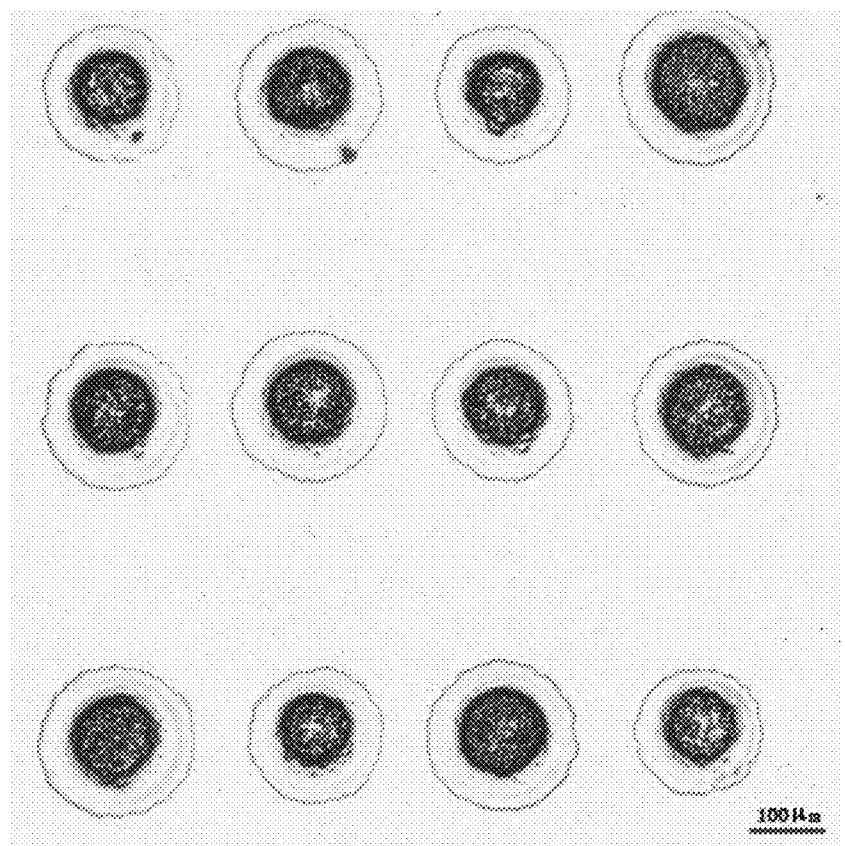
FIG. 4 is an image of solder paste voxels transferred by the method of the present invention under a confocal microscope.

FIG. 4 shows an image of solder paste spots transferred using the present invention under a confocal microscope.

A solder paste laser induced forward transfer method according to the present invention may be implemented by the following steps:

step 1: importing a circuit drawing of a receiving substrate 12 to be printed into a computer control system 14; planning, by the computer control system 14, a scanning route and scanning speed of a laser beam 15 according to the positions of pads on the receiving substrate 12 to be printed; and selecting laser parameters and parameters of a beam shaping module according to the shape and size of each pad;

step 2: selecting a transparent substrate 8 having a desired groove depth according to the thickness of a solder paste required in actual production, and coating the solder paste into the entire groove by blade coating to form a solder paste film 9 in the groove; keeping the solder paste film 9 facing downward, then fixing the transparent substrate 8 by a clamp 10 to which the Z-axis lifting table 11 is connected; adjusting the distance between the transparent substrate 8 and the receiving substrate 12; and after the distance adjustment is completed, starting solder paste transfer;

step 3: before each laser pulse emission, controlling, by the computer control system 14, the rotation of a two-dimensional galvanometer 6 according to the pre-planned route to change the laser beam path; and adjusting energy distribution of laser spots according to the preset laser parameters and the parameters of the beam shaping module;

step 4: after the parameters are adjusted, causing the beam emitted by the laser emitter 1 and shaped by the beam shaping module to enter an optical path adjustment module composed of the two-dimensional galvanometer 6 and an f-θ lens 7; after the direction of the optical path is changed by the two-dimensional galvanometer 6, finally focusing the beam, after its passing through the f-θ lens 7, above the solder paste film 9 of step 2; wherein the laser beam 15 passes through the transparent substrate 8 and is absorbed by the solder paste film 9, so that the irradiated portion is partially vaporized, bubbles 16 are formed inside the solder paste film 9, the surrounding unvaporized portion is impelled toward the receiving substrate 12 with continuous expansion of the bubbles 16, and a stable bridge structure 17 is formed between the transparent substrate 8 and the receiving substrate 12; and step 5: repeating step 3 and step 4 until a stable bridge structure 17 is formed between all the pads on the receiving substrate 12 and the transparent substrate 8; thereafter, controlling, by the computer control system 14, the Z-axis lifting table 11 to rise, so that the transparent substrate 8 vertically leaves the receiving substrate 12, all the bridge structures 17 break to leave solder paste voexls 18, and the entire receiving substrate 12 is thus printed.

As described above, the present invention can be preferably implemented.

The embodiments of the present invention are not limited to the above embodiments. Any other changes, modifications, substitutions, combinations or simplifications made without departing from the spirit essence and principle of the present invention shall be equivalent replacements, and shall be comprised within the protection scope of the present invention.

The invention claimed is:

1. A solder paste laser induced forward transfer device, comprising:
   a laser unit,
   a computer control system; and
   a solder paste transfer module,
   wherein the computer control system controls laser beam emitted from the laser unit and motion of the solder paste transfer module;
   the solder paste transfer module comprises a transparent substrate, a clamp, a Z-axis lifting table, a receiving substrate, and an XYZ-axis moving platform;
   a lower surface of the transparent substrate has a groove for receiving a solder paste film;
   the receiving substrate and the Z-axis lifting table are placed on the XYZ-axis moving platform to adjust relative positions of the receiving substrate and laser beam spots;
   the clamp is mounted on the Z-axis lifting table; and the groove of the transparent substrate faces downward and is placed in parallel above the receiving substrate, and the clamp clamps an edge of the transparent substrate and is carried by the Z-axis lifting table to vertically lift above the receiving substrate so as to adjust a distance between the transparent substrate and the receiving substrate.

2. The solder paste laser induced forward transfer device according to claim 1, wherein the laser unit comprises a laser emitter, a beam shaping module, and an optical path adjustment module that are sequentially connected by an optical path; and
   the laser emitter, the beam shaping module, the optical path adjustment module, and the solder paste transfer module are respectively connected to the computer control system.

3. The solder paste laser induced forward transfer device according to claim 2, wherein the beam shaping module comprises beam expanding lens, an aperture, a flat-top beam shaper, and a spatial light modulator that are sequentially connected by the optical path; and
   the optical path adjustment module comprises a two-dimensional galvanometer and f-θ lens that are sequentially connected by an optical path.

4. The solder paste laser induced forward transfer device according to claim 3, wherein the groove for receiving the solder paste film has a depth of 20-150 μm.

5. The solder paste laser induced forward transfer device according to claim 4, wherein the receiving substrate is a PCB.

6. A solder paste laser induced forward transfer method, wherein the method is implemented by using the solder paste laser induced forward transfer device according to claim 5, comprising the following steps:
   step (1): importing a circuit diagram of the receiving substrate to be printed into the computer control system, planning, by the computer control system, a scanning route and scanning speed of a laser beam according to positions of pads on the receiving substrate to be printed, and selecting laser parameters and parameters of the beam shaping module according to shape and size of each pad;
   step (2): selecting the transparent substrate having a desired groove depth according to a thickness of a solder paste required in actual production, and coating the solder paste into the entire groove by blade coating to form the solder paste film in the groove; keeping the solder paste film facing downward, then fixing the transparent substrate by the clamp to which the Z-axis lifting table is connected; and adjusting the distance between the transparent substrate and the receiving substrate;

step (3): before each laser pulse emission, controlling, by the computer control system a rotation of a two-dimensional galvanometer according to a pre-planned route to change the laser beam path;

step (4): causing the beam emitted by the laser emitter and shaped by the beam shaping module to enter the optical path adjustment module composed of the two-dimensional galvanometer and f-θ lens; after a direction of the optical path is changed by the two-dimensional galvanometer, finally focusing the beam, after the beam passing through the f-θ lens, above the solder paste film of step; wherein after the laser beam passes through the transparent substrate and is absorbed by the solder paste film, an irradiated portion is partially vaporized, bubbles are formed inside the solder paste film, surrounding unvaporized portion is impelled toward the receiving substrate with continuous expansion of the bubbles, and a stable bridge structure is formed between the transparent substrate and the receiving substrate; and step (5): repeating step and step until the stable bridge structures are formed between all the pads on the receiving substrate and the transparent substrate; thereafter, controlling, by the computer control system, the Z-axis lifting table to rise, so that the transparent substrate vertically leaves the receiving substrate, all the bridge structures break to leave solder paste voxels, and an entire of the receiving substrate is thus printed.

* * * * *